US010425087B1

(12) United States Patent
Ryu et al.

(10) Patent No.: US 10,425,087 B1
(45) Date of Patent: Sep. 24, 2019

(54) PHASE ADJUSTMENT APPARATUS AND OPERATION METHOD THEREOF

(71) Applicant: KOREA ADVANCED INSTITUTE OF SCIENCE AND TECHNOLOGY, Daejeon (KR)

(72) Inventors: Seung Tak Ryu, Daejeon (KR); Woo Cheol Kim, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 15/956,335

(22) Filed: Apr. 18, 2018

(30) Foreign Application Priority Data

Mar. 13, 2018 (KR) .................. 10-2018-0029294

(51) Int. Cl.
*H03K 5/26* (2006.01)
*H03L 7/095* (2006.01)

(52) U.S. Cl.
CPC .................. *H03L 7/095* (2013.01)

(58) Field of Classification Search
CPC .................. H03K 5/26; H03K 5/06
See application file for complete search history.

(56) References Cited

U.S. PATENT DOCUMENTS

| | | | | |
|---|---|---|---|---|
| 4,775,989 A * | 10/1988 | Takatori | ............... | H04L 7/0331 375/293 |
| 5,963,059 A * | 10/1999 | Partovi | ............... | H03D 13/004 327/12 |
| 5,966,033 A * | 10/1999 | Miller | ............... | H03D 13/004 327/12 |
| 6,014,042 A * | 1/2000 | Nguyen | ............... | H03K 5/26 323/315 |
| 6,528,982 B1 * | 3/2003 | Yanagisawa | ........... | G01R 25/00 324/76.77 |
| 6,674,314 B2 * | 1/2004 | Takai | ............... | H03K 5/131 327/158 |
| 6,690,209 B1 * | 2/2004 | Cyrusian | ............. | H03D 13/004 327/12 |
| 7,443,247 B2 * | 10/2008 | Camuffo | ............... | H03L 7/0891 327/156 |
| 7,459,949 B2 * | 12/2008 | Mai | ............... | H03L 7/0812 327/158 |
| 7,509,516 B2 * | 3/2009 | Prodanov | ............... | G06F 1/105 713/500 |
| 7,622,967 B2 * | 11/2009 | Kimura | ............... | H03H 11/16 327/156 |
| 7,791,382 B2 * | 9/2010 | Nedachi | ............... | H03H 11/265 327/141 |

(Continued)

OTHER PUBLICATIONS

Communication dated Jun. 4, 2019, issued by the Korean Intellectual Property Office in corresponding Korean Application No. 10-2018-0029294.

(Continued)

*Primary Examiner* — Thomas J. Hiltunen
(74) *Attorney, Agent, or Firm* — Sughrue Mion, PLLC

(57) ABSTRACT

The exemplary embodiments of the present disclosure relate to a phase adjustment apparatus, and its operation method, provided with a phase detector, phase controller and phase calibrator for reducing complexity of a circuit and enabling execution of a phase adjustment operation in the background.

19 Claims, 8 Drawing Sheets

(56) References Cited

U.S. PATENT DOCUMENTS

| | | | | |
|---|---|---|---|---|
| 7,969,166 | B2* | 6/2011 | Fasshauer | H03K 17/955 324/662 |
| 7,999,583 | B2* | 8/2011 | Rhee | G01R 31/31709 327/147 |
| 8,149,031 | B1* | 4/2012 | Aslanzadeh | H03L 7/0816 327/147 |
| 8,594,608 | B2* | 11/2013 | Namba | H03B 21/02 331/175 |
| 9,869,553 | B2* | 1/2018 | Boser | G01C 19/5776 |
| 2007/0127615 | A1* | 6/2007 | Prodanov | G06F 1/105 375/375 |
| 2008/0061838 | A1* | 3/2008 | Wang | H03D 13/003 327/3 |
| 2012/0064844 | A1* | 3/2012 | Miyashita | H03L 7/16 455/84 |
| 2017/0373709 | A1* | 12/2017 | Kondo | H03L 7/085 |

OTHER PUBLICATIONS

Wenjing Yin, et al., "A 0.7-to-3.5 GHz 0.6-to-2.8 mW Highly Digital Phase-Locked Loop With Bandwidth Tracking", IEEE Journal of Solid-State Circuits, vol. 46, No. 8, Aug. 2011, pp. 1870-1880 (11 pages total).

* cited by examiner

PHASE ADJUSTMENT APPARATUS AND OPERATION METHOD THEREOF

RELATED APPLICATIONS

The present application is based on, and claims priority from, Korean Patent Application Number 10-2018-0029294, filed on Mar. 13, 2018, the disclosure of which is hereby incorporated by reference herein in its entirety.

TECHNICAL FIELD

The exemplary embodiments of the present disclosure relate to a phase adjustment apparatus and operation method thereof.

BACKGROUND

The statements in this section merely provide background information related to the present disclosure and do not necessarily constitute prior art.

Generally, a semiconductor device receives an external clock signal, generates an internal clock signal, and uses the internal clock signal as a reference for adjusting the operation timing of the internal circuit. In order to generate the internal clock signal, the semiconductor device includes an internal clock signal generation circuit. Typical examples of the internal clock signal generation circuit include a phase locked loop (PLL) and a delay locked loop (DLL).

The internal clock signal generation circuit receives a clock signal serving as a reference (hereinafter referred to as a reference clock signal) and generates an internal clock signal having a phase corresponding thereto. The internal clock signal generation circuit performs a locking operation since most internal clock signals that are initially generated do not have a phase corresponding to the reference clock signal. Here, the locking operation means an operation of adjusting the phase of the internal clock signal to the phase corresponding to the reference clock signal.

In order to perform the locking operation, the internal clock signal generation circuit is required to perform a phase detection operation for detecting a phase difference between the internal clock signal and the reference clock signal. And, the internal clock signal generation circuit is required to perform a phase calibration operation for calibrating the phase of the internal clock signal depending on the result of the detection.

The internal clock signal generation circuit is required to include a phase detection circuit and an phase adjustment circuit for performing the locking operation.

SUMMARY

In accordance with some embodiments, the present disclosure provides a phase adjustment apparatus, including a phase detector configured to output a phase control signal (ED_OFF) having a pulse width proportional to a phase difference between a reference clock signal and a target clock signal, and a phase controller configured to adjust a level of a control voltage signal (V_CTRL) for calibrating a phase of the target clock signal in a direction of decreasing the pulse width based on an extent and direction of change in the pulse width.

In accordance with another embodiment, the present disclosure provides a phase adjustment apparatus, including a phase detector configured to output a phase control signal (ED_OFF) having a pulse width proportional to a phase difference between a reference clock signal and a target clock signal; a phase controller configured to output a control voltage signal (V_CTRL) level-adjusted in a direction of decreasing the pulse width based on an extent and direction of change in the pulse width; and a phase calibrator configured to calibrate a phase of the target clock signal using the control voltage signal.

In accordance with another embodiment, the present disclosure provides a method of adjusting a phase difference between a reference clock signal and a target clock signal by a phase adjustment apparatus, including outputting a phase control signal (ED_OFF) having a pulse width proportional to the phase difference between the reference clock signal and the target clock signal, outputting a control voltage signal (V_CTRL) level-adjusted in a direction of decreasing the pulse width based on an extent and direction of change in the pulse width, and calibrating a phase of the target clock signal using the control voltage signal.

DETAILED DESCRIPTION

Figure 1:
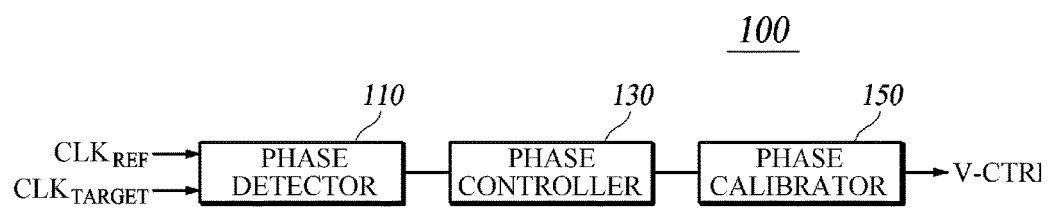
FIG. 1 is a diagram schematically illustrating a phase adjustment apparatus according to the present disclosure.

Embodiments of the present disclosure provide a phase adjustment apparatus for sensing a change in a phase control signal reflecting a phase difference between input signals and calibrating the phase of an input signal, and an operation method thereof.

Hereinafter, at least one embodiment of the present disclosure will be described in detail with reference to the accompanying drawings. In the following description, like reference numerals designate like elements, although the elements are shown in different drawings. Further, in the following description of the at least one embodiment, a detailed description of known functions and configurations incorporated herein will be omitted for the purpose of clarity and for brevity.

Additionally, in describing the components of the present disclosure, terms like first, second, A, B, (a), and (b) are used. These are solely for the purpose of differentiating one component from another, and one of ordinary skill would understand the terms are not to imply or suggest the substances, the order or sequence of the components. If a component is described as 'connected', 'coupled', or 'linked' to another component, one of ordinary skill in the art would understand the components are not necessarily directly 'connected', 'coupled', or 'linked' but also are indirectly 'connected', 'coupled', or 'linked' via a third component. In addition, Hereinafter, some embodiments will be described in more detail with reference to the accompanying drawings.

FIG. 1 is a diagram schematically illustrating a phase adjustment apparatus according to the present disclosure.

Referring to FIG. 1, the phase adjustment apparatus 100 is a circuit for synchronizing the phase of a target clock signal CLK_TARGET with the phase of a reference clock signal CLK_REF. And, the phase adjustment apparatus 100 may include a phase detector 110, a phase controller 130 and a phase calibrator 150.

The phase detector 110 receives the reference clock signal CLK_REF and the target clock signal CLK_TAR and outputs a phase control signal ED_OFF reflecting the phase difference between the signals. Here, the phase control signal ED_OFF has a pulse width (i.e., a high-level time) proportional to the phase difference between the reference clock signal CLK_REF and the target clock signal CLK_TAR. That is, when the reference clock signal CLK_REF and the target clock signal CLK_TAR have the same phase, the pulse width of the phase control signal ED_OFF is minimized.

The phase controller 130 outputs a control voltage signal V_CTRL for synchronizing the phase of the target clock signal CLK_TARGET with the phase of the reference clock signal CLK_REF by minimizing the pulse width of the phase control signal ED_OFF output from the phase detector 110.

To this end, the phase controller 130 senses the extent and direction of change in the pulse width of the phase control signal ED_OFF relative to the immediately preceding period.

When the extent of change in the pulse width exceeds a predetermined threshold value, the phase controller 130 may determine that the phase of the target clock signal CLK_TAR is different from the phase of the reference clock signal CLK_REF. Here, the threshold value may be preset in consideration of system requirements and the like.

When the pulse width increases compared to the immediately preceding period, the phase controller 130 outputs the control voltage signal V_CTRL whose level is raised by a predetermined extent in a direction opposite to the direction of level change of the control voltage signal V_CTRL in the immediately preceding period. In contrast, when the pulse width decreases compared to the immediately preceding period, the phase controller 130 outputs the control voltage signal V_CTRL whose level is raised by a predetermined extent in the same direction as the direction of level change of the control voltage signal V_CTRL in the immediately preceding period.

When the extent of change in the pulse width is less than or equal to the predetermined threshold, the phase controller 130 may determine that the phase of the phase of the target clock signal CLK_TAR is equal to the reference clock signal CLK_REF. Then, the phase controller 130 outputs a control voltage signal V_CTRL of a predetermined level (for example, '0V') to maintain the phase of the target clock signal CLK_TAR.

The phase calibrator 150 calibrates the phase of the target clock signal CLK_TAR by controlling a delay circuit using the control voltage signal V_CTRL output from the phase controller 130. Here, the delay circuit may include a clock buffer circuit or a thyristor-like delay circuit, etc., including at least one delay element (e.g., an inverter, etc.).

Hereinafter, a phase detector according to the present disclosure will be described in detail with reference to FIG. 2.

Figure 2:
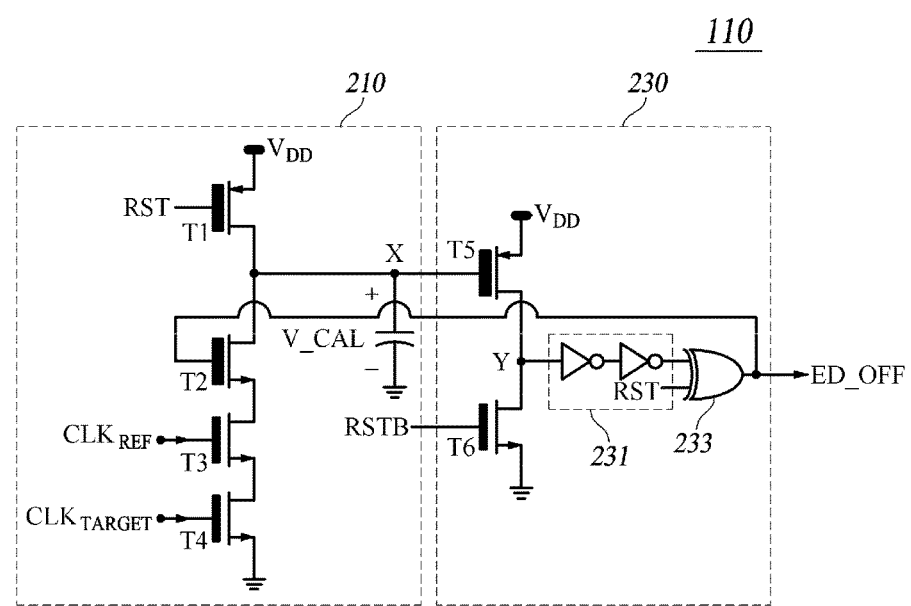
FIG. 2 is a diagram illustrating a phase detector according to the present disclosure.

FIG. 2 is a diagram illustrating a phase detector according to the present disclosure.

Referring to FIG. 2, the phase detector 110 may include a capacitor charging/discharging unit 210 and a phase control signal generator 230.

The capacitor charging/discharging unit 210 may charge a capacitor based on an RST signal. And, the capacitor charging/discharging unit 210 may discharge the capacitor based on the phase control signal ED_OFF fed back by the phase control signal generator 230, the reference clock signal CLK_REF, and the target clock signal CLK_TAR. Here, the capacitor preferably has a relatively large capacitance in order to remove a random jitter component. It is to be noted, however, that this is merely an example, and the present disclosure is not limited thereto.

The capacitor charging/discharging unit 210 may include a first transistor T1, a second transistor T2, a third transistor T3, a fourth transistor T4, and a capacitor C. Here, the first transistor T1 may be connected between a power supply terminal VDD and a node X, and the second to fourth transistors T2 to T4 may be serially connected between the node X and a ground terminal. The capacitor C may be connected to the node X.

Specifically, the first transistor T1 is connected between the power supply terminal VDD and the node X. The first transistor T1 is turned on or off based on the RST signal. Here, the RST signal refers to a signal for resetting the phase adjustment apparatus according to a predetermined duty cycle. Then, while the first transistor T1 is turned on, the capacitor C connected between the node X and the ground terminal is charged up to VDD.

The first transistor T1 is preferably implemented as a PMOS transistor, but the present disclosure is not limited thereto.

The second to fourth transistors T2 to T4 may be sequentially connected in series between the node X and the ground terminal.

The second transistor T2 is turned on or off based on a phase control signal ED_OFF fed back by the phase control signal generator 230. The third transistor T3 is turned on or off based on the reference clock signal CLK_REF and the fourth transistor T4 is turned on or off based on the target clock signal CLK_TAR.

While all of the second to fourth transistors T2 to T4 are turned on, the capacitor C is discharged. Accordingly, the discharging speed of the capacitor C is changed depending on the phase difference between the reference clock signal CLK_REF and the target clock signal CLK_TAR.

The second to fourth transistors T2 to T4 are preferably implemented as NMOS transistors, but the present disclosure is not limited thereto.

The phase control signal generator 230 may generate and output the phase control signal ED_OFF corresponding to the time required for the capacitor C to be discharge up to a predetermined voltage level (hereinafter referred to as "the discharge time of the capacitor C"). That is, the pulse width of the phase control signal ED_OFF may be proportional to the discharge time of the capacitor C.

The phase control signal generator 230 may include a fifth transistor T5, a sixth transistor T6, an inverter unit 231, and an XOR gate 233.

Specifically, the fifth transistor T5 is connected between a power supply terminal VDD and a node Y. And, the fifth transistor T5 is turned on or off based on the level of the voltage V_CAL of the capacitor C.

The fifth transistor T5 is preferably implemented as a PMOS transistor, but the present disclosure is not limited thereto.

The sixth transistor T6 may be connected between the node Y and the ground terminal and may be turned on or off based on the inverted signal RSTB of the RST signal. That is, the sixth transistor T6 and the first transistor T1 are alternately turned on.

The sixth transistor T6 is preferably implemented as an NMOS transistor, but the present disclosure is not limited thereto.

The XOR gate 233 performs an XOR operation on a voltage level signal of the node Y time-delayed by the inverter unit 231 and the RST signal to output a phase control signal ED_OFF.

Hereinafter, the operation method of the phase detector 110 described above will be described with reference to Table 1.

Table 1 is a state table of the phase detector 110 according to the present disclosure.

TABLE 1

| STATE | RST | T1 | V_CAL | T5 | T6 | ED_OFF | T2 | T3 | T4 |
|---|---|---|---|---|---|---|---|---|---|
| 1 | High | ON | VDD >Vth | ON | OFF | Low | OFF | CLK_REF | CLR_TAR |
| 2 | Low | OFF | VDD ↓ >Vth | ON | ON | High | ON | CLK_REF | CLR_TAR |
| 3 | Low | OFF | VDD ↓ <Vth | OFF | ON | Low | OFF | CLK_REF | CLR_TAR |

Referring to Table 1, in a first state (STATE 1), while the RST signal is at the high level (or the logic level '1'), the first transistor T1 is turned on and the voltage V_CAL of the capacitor C is charged up to VDD. Since the voltage V_CAL of the capacitor C is higher than the threshold voltage Vth of the fifth transistor T5, the fifth transistor T5 is turned on. In this case, the phase control signal ED_OFF, which is a result of the XOR operation of the voltage level signal (high level) of the node Y and the RST signal (high level), is set to the low level.

The low-level phase control signal ED_OFF is input to the gate of the second transistor T2, turning off the second transistor T2. Accordingly, the capacitor C is not discharged.

In a second state (STATE 2), while the RST signal is at the low level (or the logic level '0'), the first transistor T1 is turned off. Since the voltage V_CAL of the capacitor C is higher than the threshold voltage Vth of the fifth transistor T5, the fifth transistor T5 maintains the "ON" state. In this case, the phase control signal ED_OFF, which is the result of the XOR operation of the voltage level signal (high level) of the node Y and the RST signal (low level), is set to the high level.

The high-level phase control signal ED_OFF is input to the gate of the second transistor T2, turning on the second transistor T2. Accordingly, the capacitor C is discharged when both the third transistor T3 and the fourth transistor T4 are turned on.

When the phase difference between the reference clock signal CLK_REF for controlling the on/off of the third transistor T3, and the target clock signal CLK_TAR for controlling the on/off of the fourth transistor T4, decreases, the duration that the both signals maintain their respective peak values becomes longer. Accordingly, the discharging speed of the capacitor C increases. If there is no phase difference between the reference clock signal CLK_REF and the target clock signal CLK_TAR, the discharging speed of the capacitor C is maximized.

On the other hand, when the phase difference between the reference clock signal CLK_REF and the target clock signal CLK_TAR increases, the duration that the both signals maintain their respective peak values becomes shorter. Accordingly, the discharging speed of the capacitor C decreases.

In a third state (STATE3), when the capacitor C is discharged and thus the voltage V_CAL of the capacitor becomes lower than the threshold voltage Vth of the fifth transistor T5, the fifth transistor T5 is turned off. In this case, the phase control signal ED_OFF, which is the result of the XOR operation of the voltage level signal (low level) of the node Y and the RST signal (low level), is set to the low level.

As a result, as the phase difference between the reference clock signal CLK_REF and the target clock signal CLK_TAR decreases, the discharging speed of the capacitor C increases, and thus the pulse width of the phase control signal ED_OFF decreases. In contrast, as the phase difference between the reference clock signal CLK_REF and the target clock signal CLK_TAR increases, the discharging speed of the capacitor C decreases, and thus the pulse width of the phase control signal ED_OFF increases.

Therefore, the phase of the target clock signal CLK_TARGET may be synchronized with the phase of the reference clock signal CLK_REF, by calibrating the phase of the target clock signal CLK_TARGET so as to minimize the pulse width of the phase control signal ED_OFF.

Hereinafter, the phase controller according to the present disclosure will be described with reference to FIGS. 3 to 5.

Figure 3:
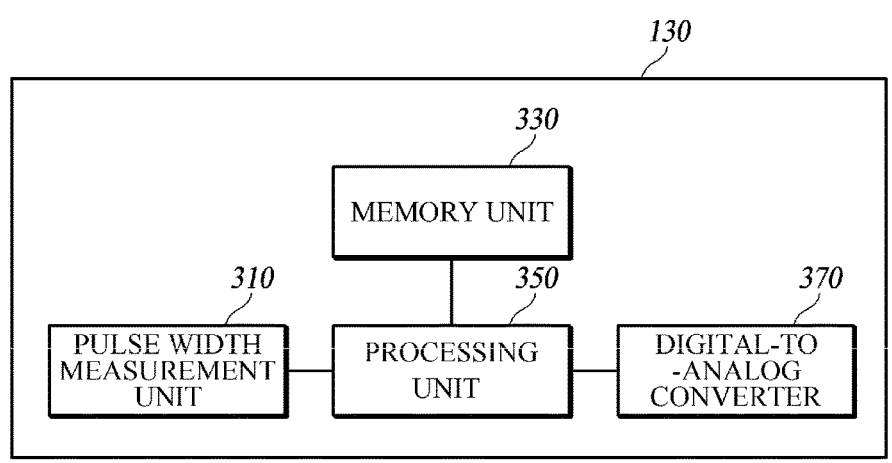
FIG. 3 is a diagram illustrating a phase controller according to the present disclosure.
Figure 4:
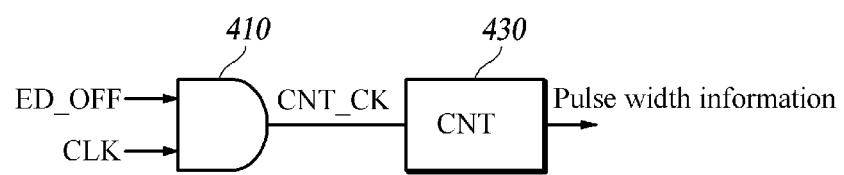
FIG. 4 is a diagram illustrating an embodiment of the pulse width measurement unit of FIG. 3.
Figure 5:
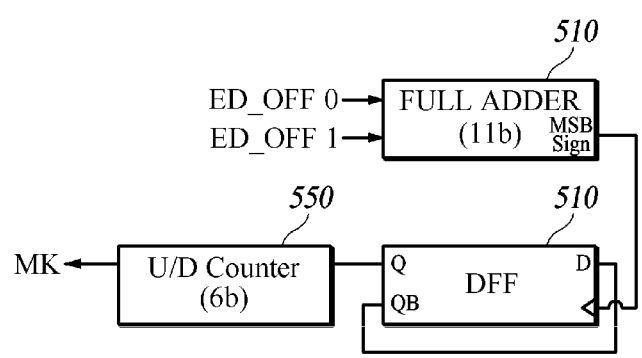
FIG. 5 is a diagram illustrating an embodiment of the processing unit of FIG. 3.

FIG. 3 is a diagram illustrating the phase controller according to the present disclosure, FIG. 4 is a diagram illustrating a specific embodiment of the pulse width measurement unit 310 of FIG. 3, and FIG. 5 is a diagram illustrating a specific embodiment of the processing unit 350 of FIG. 3.

Referring to FIG. 3, the phase controller 130 may include a pulse width measurement unit 310, a memory unit 330, a processing unit 350, and a digital-to-analog converter 370.

The pulse width measurement unit 310 may measure the pulse width of the phase control signal ED_OFF output from the phase detector 110.

The specific configuration of the pulse width measurement unit 310 according to one aspect of the present disclosure is shown in FIG. 4. It is to be noted, however, that this configuration is merely an example, and the present disclosure is not limited thereto.

Referring to FIG. 4, the pulse width measurement unit 310 may include an AND gate 410 and a counter 430. The AND gate 410 performs an AND operation on the phase control signal ED_OFF and an input clock signal. Then, the counter 430 counts the number of rising edges in the result of the operation of the AND gate 410. That is, the pulse width measurement unit 310 yields the number of counted rising edges to indicate the pulse width of the phase control signal ED_OFF.

The memory unit 330 stores information on the pulse width of the phase control signal ED_OFF (hereinafter referred to as "pulse width information"), which is measured by the pulse width measurement unit 310, for each period. Preferably, the memory unit 330 stores pulse width information about the phase control signal ED_OFF in the immediately preceding period and the current period. Here, the pulse width information about the phase control signal ED_OFF may be binary information about the number of pulse rising edges.

The memory unit 330 also stores information indicating the direction of level change of the control voltage signal V_CTRL (hereinafter referred to as "level change information") for each period. Here, the level change information may be 1-bit binary information. For example, when the direction of change of the control voltage signal V_CTRL in a specific period is an increasing direction compared to the case of the immediately preceding period, the binary level change information may have a value of '1'. On the other hand, when the direction of change of the control voltage signal V_CTRL in a specific period is a decreasing direction compared to the case of the immediately preceding period, the binary level change information may have a value of '0'.

According to an aspect of the present disclosure, the memory unit 330 may include a plurality of D flip-flops (DFFS), each of which stores pulse width information and level change information for each period. It should be noted, however, that this is merely exemplary and that the present disclosure is not limited thereto.

The processing unit 350 generates a control signal MK for adjusting the control voltage signal V_CTRL, based on the pulse width information and the level change information.

Specifically, when the extent of change in the pulse width compared to the immediately preceding period exceeds a predetermined threshold, the processing unit 350 determines that the phase of the target clock signal CLK_TAR is different from the phase of the reference clock signal CLK_REF.

In addition, when the pulse width increases compared to the immediately preceding period, the processing unit 350 generates a control signal MK for raising the level of the control voltage signal V_CTRL in a direction opposite to the direction of level change of the control voltage signal V_CTRL in the immediately preceding period. Conversely, when the pulse width decreases compared to the immediately preceding period, the processing unit 350 generates a control signal MK for raising the level of the control voltage signal V_CTRL in the same direction as the direction of level change of the control voltage signal V_CTRL in the immediately preceding period.

When the extent of change in the pulse width compared to the immediately preceding period is less than or equal to the predetermined threshold, the processing unit 350 determines that the phase of the target clock signal CLK_TAR is equal to the phase of the reference clock signal CLK_REF.

Then, the processing unit 350 generates a control signal MK for adjusting the control voltage signal V_CTRL to a predetermined level (for example, '0 V') in order to maintain the phase of the target clock signal CLK_TAR.

The specific configuration of the processing unit 350 operating as described above is shown in FIG. 5. It is to be noted, however, that this configuration is merely an example, and the present disclosure is not limited thereto.

Referring to FIG. 5, the processing unit 350 may include a full adder 510 and a D flip-flop (DFF) 530, which are configured to sense a change in the pulse width of the phase control signal ED_OFF. Here, the full adder 510 and the DFF 530 operate as a subtractor for calculating the difference in pulse width of the phase control signal ED_OFF between the current period and the immediately preceding period.

The processing unit 350 may further include an up/down (U/D) counter 550 for generating a control signal MK based on the change in the pulse width of the phase control signal ED_OFF. Here, the up/down counter 550 generates the control signal MK by counting the direction and extent of change in the difference between the calculated pulse widths of the phase control signal ED_OFF.

Referring back to FIG. 3, the digital-to-analog converter 370 outputs a control voltage signal V_CTRL obtained by converting the control signal MK generated by the processing unit 350 into an analog signal. Here, the control voltage signal V_CTRL output from the digital-to-analog converter 370 is input to the phase compensator 150 described above with reference to FIG. 1 and is used in synchronizing the phase of the target clock signal CLK_TARGET with the phase of the reference clock signal CLK_REF.

According to an aspect of the present disclosure, the digital-to-analog converter 370 may include an R-2R ladder digital-to-analog converter. Here, the R-2R ladder digital-to-analog converter has an advantage in that it can be implemented in a small area for up to 10-bit resolution. It is to be noted, however, that this is merely an example, and the present disclosure is not limited thereto.

Hereinafter, the operation of the phase adjustment apparatus according to the present disclosure will be described in detail with reference to FIGS. 6A and 6B.

Figure 6A:
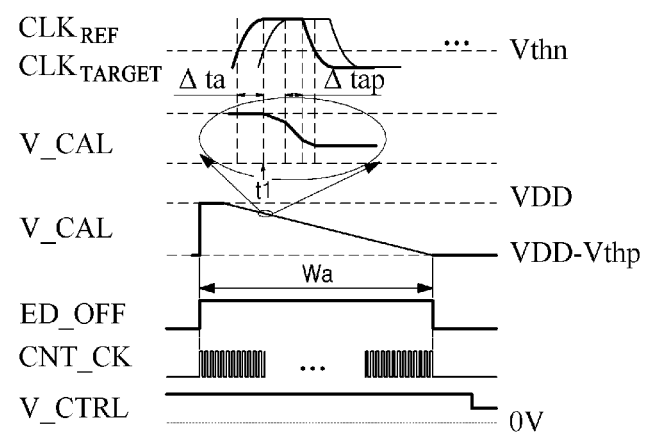
FIG. 6A is a diagram illustrating a waveform at the initial stage of the operation of a phase adjustment apparatus according to the present disclosure.

FIG. 6A is a diagram illustrating a waveform at the initial stage of the operation of a phase adjustment apparatus according to the present disclosure.

Figure 6B:
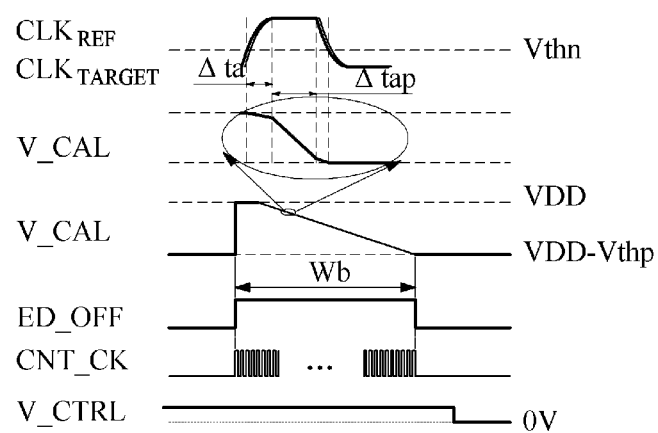
FIG. 6B is a diagram illustrating a waveform at the final stage of the operation of a phase adjustment apparatus according to the present disclosure.

FIG. 6B is a diagram illustrating a waveform at the final stage of the operation of a phase adjustment apparatus according to the present disclosure.

FIG. 6A denotes an operation waveform of the phase adjustment apparatus obtained when the phase difference between a reference clock signal and a target clock signal exceeds a predetermined threshold. FIG. 6B denotes an operation waveform of the phase adjustment apparatus obtained when the phase difference between the reference clock signal and the target clock signal is equal to or less than the predetermined threshold.

In FIGS. 6A and 6B, 'CLK_REF' denotes a reference clock signal input to the phase detector, and 'CLK_TAR' denotes a target clock signal input to the phase detector. 'V_CAL' denotes a voltage level of the capacitor of the phase detector, and 'ED_OFF' denotes a phase control signal that maintains a constant high level while the voltage level of the capacitor is at a high level. 'CNT_CK' denotes a clock signal used for the phase controller to use in an AND operation to measure the pulse width of the phase control signal ED_OFF, and 'V_CTRL' denotes a control voltage signal for adjusting the phase of the target clock signal.

First, referring to FIG. 6A, it can be seen that the phase of the target clock signal CLK_TAR lags behind the phase of the reference clock signal CLK_REF by Δta, which is larger than the phase difference Δtb between the reference clock signal CLK_REF and the target clock signal CLK_TAR in FIG. 6B.

As described above with reference to FIG. 2, the capacitor of the phase detector starts to be discharged from the time at which the reference clock signal CLK_REF and the target clock signal CLK_TAR are both at the high level (that is, the extent of each of the clock signals is greater than the threshold voltage of the transistor).

The capacitor of the phase detector has the highest discharging speed (that is, the slope of the V_CAL waveform) in an interval in which both signals reach a peak value (hereinafter referred to as "peak interval").

In FIG. 6A, the capacitor starts to be discharged from at time t1, and is discharged most rapidly at the peak interval Δtap. It can be seen that Δtap is shorter than Δtbp, which is the peak interval of FIG. 6B. Therefore, the overall discharging speed of the capacitor of FIG. 6A becomes slower than that of FIG. 6B. Accordingly, the pulse width Wa of the phase control signal ED_OFF in FIG. 6A becomes greater than the pulse width Wb in FIG. 6B.

According to this embodiment, the pulse width of the phase control signal ED_OFF is minimized when the phase of the target clock signal CLK_TAR is equal to the phase of the reference clock signal CLK_REF.

Thus, in FIG. 6A, when the pulse width of the phase control signal ED_OFF and the level of the control voltage signal V_CTRL in the current period decrease from the immediately preceding period, the phase controller outputs the control voltage signal V_CTRL lowered by a predetermined extent in the next period.

Next, referring to FIG. 6B, it can be seen that the phase of the target clock signal CLK_TAR lags behind the phase of the reference clock signal by Δtb, which is smaller than the predetermined threshold Δtth. Therefore, the phase controller determines that the target clock signal CLK_TAR is synchronized with the reference clock signal CLK_REF, and thus outputs a control voltage signal V_CTRL of a predetermined level (for example, '0V') to maintain the current phase of the target clock signal CLK_TAR.

Hereinafter, the operation method of the phase adjustment apparatus according to the present disclosure will be described in detail with reference to FIG. 7.

Figure 7:
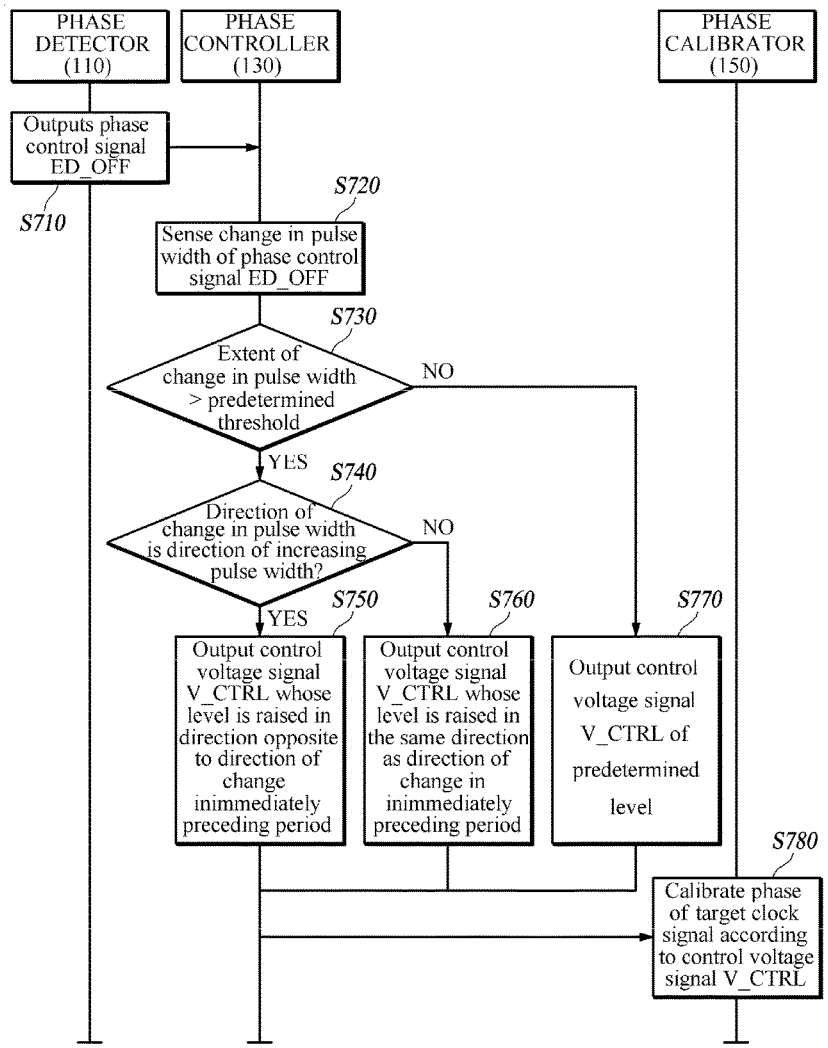
FIG. 7 is a flowchart illustrating an operation method of the phase difference detection apparatus according to the present disclosure.

FIG. 7 is a flowchart illustrating an operation method of the phase adjustment apparatus according to the present disclosure.

Referring to FIG. 7, in step S710, the phase detector 110 receives the reference clock signal CLK_REF and the target clock signal CLK_TAR. And, the phase detector 110 outputs a phase control signal ED_OFF proportional to the phase difference between the signals.

In step S720, the phase controller 130 senses the extent and direction of change in the pulse width of the phase control signal ED_OFF output from the phase detector 110 compared to the immediately preceding period.

In step S730, the phase controller 130 compares the extent of change in the pulse width sensed in step S720 with a predetermined threshold to determine whether to calibrate the phase of the target clock signal CLK_TAR.

If the sensed the extent of change in the pulse width exceeds the predetermined threshold ("YES") as a result of the comparison in step S730, the phase controller 130 determines to calibrate the phase of the target clock signal CLK_TAR and proceeds to step S740.

In step S740, the phase controller 130 determines whether the direction of change in the pulse width sensed in step S720 is the direction of increasing the pulse width, and determines whether to maintain the direction of level change of the control voltage signal V_CTRL.

If the sensed the direction of change in the pulse width is the direction of increasing the pulse width as a result of the comparison in step S740 ("YES"), the phase controller 130 outputs, in step S750, the control voltage signal V_CTRL whose level is raised by a predetermined extent in the opposite direction of level change of the control voltage signal V_CTRL in the immediately preceding period.

If the sensed the direction of change in the pulse width is the direction of decreasing the pulse width as a result of the comparison in step S740 ("NO"), the phase controller 130 outputs, in step S760, the control voltage signal V_CTRL whose level is lowered by a predetermined extent in the same direction of level change of the control voltage signal V_CTRL in the immediately preceding period.

If the sensed the extent of change in the pulse width is less than or equal to the predetermined threshold ("NO") as a result of comparison in step S730, the phase controller 130 determines that the target clock signal CLK_TAR is synchronized with the reference clock signal CLK_REF, and outputs the control voltage signal V_CTRL of a predetermined level (for example, '0V') for maintaining the phase of the current target clock signal CLK_TAR in step S770.

In step S780, the phase calibrator 150 calibrates the phase of the target clock signal CLK_TAR by controlling a delay circuit using the control voltage signal V_CTRL output from the phase controller 130.

Although the multiple steps in FIG. 7 are described to be sequentially performed as mere examples for describing the technical idea of some embodiments, one of ordinary skill in the pertinent art would appreciate that various modifications, additions and substitutions are possible by performing the illustrated sequences in FIG. 7 in a different order or at least one of those steps in parallel without departing from the idea and scope of the embodiments, and hence the example shown in FIG. 7 is not limited to the chronological orders.

The steps shown in FIG. 7 can be implemented as computer-readable codes on a computer-readable recording medium. The computer-readable recording medium includes any type of recording device on which data that can be read by a computer system are recordable. Examples of the computer-readable recording medium include a magnetic recording medium (e.g., a ROM, a floppy disk, a hard disk, etc.), an optically readable medium (e.g., a CD-ROM, a DVD, etc.), and the like, and also include one implemented in the form of a carrier wave (e.g., transmission through the Internet). Further, the computer-readable recording medium can be distributed in computer systems connected via a network, and computer-readable codes can be stored and executed in a distributed mode.

According to the phase adjustment apparatus of the present disclosure as described above, the phase difference between the reference clock signal and the target clock signal may be adjusted using a relatively simple digital operation, thereby reducing complexity of the circuit and enabling execution of the phase adjustment operation in the background.

At least one of the components, elements, modules or units represented by a block as illustrated in FIGS. 1 and 3-5 may be embodied as various numbers of hardware, software and/or firmware structures that execute respective functions described above, according to an exemplary embodiment. For example, at least one of these components, elements, modules or units may use a direct circuit structure, such as a memory, a processor, a logic circuit, a look-up table, etc. that may execute the respective functions through controls of one or more microprocessors or other control apparatuses. Also, at least one of these components, elements, modules or units may be specifically embodied by a module, a program, or a part of code, which contains one or more executable instructions for performing specified logic functions, and executed by one or more microprocessors or other control apparatuses. Also, at least one of these components, elements, modules or units may further include or may be implemented by a processor such as a central processing unit (CPU) that performs the respective functions, a microprocessor, or the like. Two or more of these components, elements, modules or units may be combined into one single component, element, module or unit which performs all operations or functions of the combined two or more components, elements, modules or units. Also, at least part of functions of at least one of these components, elements, modules or units may be performed by another of these components, elements, modules or units. Further, although a bus is not illustrated in the above block diagrams, communication between the components, elements, modules or units may be performed through the bus. Functional aspects of the above exemplary embodiments may be implemented in algorithms that execute on one or more processors. Furthermore, the components, elements, modules or units represented by a block or processing steps may employ any number of related art techniques for electronics configuration, signal processing and/or control, data processing and the like.

Although exemplary embodiments of the present disclosure have been described for illustrative purposes, those skilled in the art will appreciate that various modifications, additions and substitutions are possible, without departing from the various characteristics of the disclosure. Therefore, exemplary embodiments of the present disclosure have been described for the sake of brevity and clarity. Accordingly, one of ordinary skill would understand the scope of the disclosure is not limited by the explicitly described above embodiments but by the claims and equivalents thereof.

What is claimed is:

1. A phase adjustment apparatus comprising:
   a phase detector configured to output a phase control signal having a pulse width proportional to a phase difference between a reference clock signal and a target clock signal; and
   a phase controller configured to adjust a level of a control voltage signal for calibrating a phase of the target clock signal in a direction of decreasing the pulse width based on an extent and direction of change in the pulse width,
   wherein the pulse width of the phase control signal indicates a time required for a capacitor charged to a predetermined initial voltage to be discharged to a predetermined threshold voltage.

2. The phase adjustment apparatus of claim 1, wherein, when the extent of change in the pulse width of the phase control signal is less than or equal to a predetermined threshold, the phase controller determines that the reference clock signal and the target clock signal are synchronized and outputs the control voltage signal at a predetermined level.

3. The phase adjustment apparatus of claim 1, wherein, when an extent of increase in the pulse width of the phase control signal exceeds a predetermined threshold, the phase controller raises a level of the control voltage signal in the opposite direction of level change in the control voltage signal in an immediately preceding period and outputs the control voltage signal.

4. The phase adjustment apparatus of claim 1, wherein, when an extent of decrease in the pulse width of the phase control signal exceeds a predetermined threshold, the phase controller raises a level of the control voltage signal in the same direction of level change in the control voltage signal in an immediately preceding period and outputs the control voltage signal.

5. The phase adjustment apparatus of claim 1, wherein the phase detector comprises:
   a first transistor connected between a power supply terminal and a connection terminal of a capacitor; and
   a plurality of transistors sequentially connected in series between the connection terminal of the capacitor C and a ground terminal.

6. The phase adjustment apparatus of claim 5, wherein the plurality of transistors comprises a second transistor, a third transistor, and a fourth transistor.

7. The phase adjustment apparatus of claim 6, wherein the first transistor is turned on by a reset signal for resetting the phase adjustment apparatus according to a predetermined duty cycle,
   wherein the second transistor is turned on by the reference clock signal,
   wherein the third transistor is turned on by the target clock signal.

8. The phase adjustment apparatus of claim 6, wherein the phase detector comprises:
   a fifth transistor and a sixth transistor sequentially connected in series between a power supply terminal and a ground terminal.

9. The phase adjustment apparatus of claim 8, wherein the fifth transistor is turned on according to a voltage across the capacitor.

10. The phase adjustment apparatus of claim 1, wherein the pulse width of the phase control signal is calculated by counting the number of rising edges in a result of performing an AND operation on the phase control signal and a predetermined clock signal.

11. The phase adjustment apparatus of claim 1, wherein the phase controller comprises:
    a memory unit configured to store information about the extent and direction of change in the pulse width of the phase control signal and information about a direction of level change of the voltage control signal.

12. A phase adjustment apparatus comprising:
    a phase detector configured to output a phase control signal having a pulse width proportional to a phase difference between a reference clock signal and a target clock signal;
    a phase controller configured to output a control voltage signal level-adjusted in a direction of decreasing the pulse width based on an extent and direction of change in the pulse width; and
    a phase calibrator configured to calibrate a phase of the target clock signal using the control voltage signal,
    wherein the pulse width of the phase control signal indicates a time required for a capacitor charged to a predetermined initial voltage to be discharged to a predetermined threshold voltage.

13. The phase adjustment apparatus of claim 12, wherein the pulse width of the phase control signal is calculated by counting the number of rising edges in a result of performing an AND operation on the phase control signal and a predetermined clock signal.

14. A method of adjusting a phase difference between a reference clock signal and a target clock signal by a phase adjustment apparatus, the method comprising:
    outputting a phase control signal having a pulse width proportional to the phase difference between the reference clock signal and the target clock signal;

outputting a control voltage signal level-adjusted in a direction of decreasing the pulse width based on an extent and direction of change in the pulse width; and calibrating a phase of the target clock signal using the control voltage signal, wherein the pulse width of the phase control signal indicates a time required for a capacitor charged to a predetermined initial voltage to be discharged to a predetermined threshold voltage.

15. The method of claim 14, wherein a discharging speed of the capacitor reaches a highest speed in an interval in which both the reference clock signal and the target clock signal have a peak value.

16. The method of claim 14, wherein the pulse width of the phase control signal is calculated by counting the number of rising edges in a result of performing an AND operation on the phase control signal and a predetermined clock signal.

17. The method of claim 14, wherein the outputting of the control voltage signal comprises:

determining, when the extent of change in the pulse width of the phase control signal is less than or equal to a predetermined threshold, that the reference clock signal and the target clock signal are synchronized and outputting the control voltage signal.

18. The method of claim 14, wherein the outputting of the control voltage signal comprises:

raising, when an extent of increase in the pulse width of the phase control signal exceeds a predetermined threshold, a level of the control voltage signal in a direction opposite to the direction of change in the control voltage signal in an immediately preceding period and outputting the control voltage signal.

19. The method of claim 14, wherein the outputting of the control voltage signal comprises:

raising, when an extent of decrease in the pulse width of the phase control signal exceeds a predetermined threshold, a level of the control voltage signal in the same direction as the direction of change in the control voltage signal in an immediately preceding period and outputting the control voltage signal.

* * * * *